(12) United States Patent
Ping et al.

(10) Patent No.: US 11,930,644 B2
(45) Date of Patent: Mar. 12, 2024

(54) SEMICONDUCTOR STRUCTURE AND STORAGE CIRCUIT

(71) Applicant: CHANGXIN MEMORY TECHNOLOGIES, INC., Hefei (CN)

(72) Inventors: Er-Xuan Ping, Hefei (CN); Xiaoguang Wang, Hefei (CN); Baolei Wu, Hefei (CN); Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 376 days.

(21) Appl. No.: 17/392,394

(22) Filed: Aug. 3, 2021

(65) Prior Publication Data

US 2022/0190028 A1 Jun. 16, 2022

Related U.S. Application Data

(63) Continuation of application No. PCT/CN2021/095596, filed on May 24, 2021.

(30) Foreign Application Priority Data

Dec. 15, 2020 (CN) .......................... 202011475739.X

(51) Int. Cl.
*H10B 61/00* (2023.01)
*G11C 11/16* (2006.01)
*H10N 50/80* (2023.01)

(52) U.S. Cl.
CPC .......... *H10B 61/22* (2023.02); *G11C 11/1659* (2013.01); *G11C 11/1673* (2013.01); *G11C 11/1675* (2013.01); *H10N 50/80* (2023.02)

(58) Field of Classification Search
CPC .... H10B 61/22; H10B 61/20; G11C 11/1659; G11C 11/1673; G11C 11/1675; G11C 11/005; G11C 11/1653; G11C 11/1655; G11C 11/1657; G11C 14/0036; H10N 50/80; H10N 50/10
See application file for complete search history.

(56) References Cited

U.S. PATENT DOCUMENTS

| | | | |
|---|---|---|---|
| 6,649,953 B2 | 11/2003 | Cha |
| 6,855,564 B2 | 2/2005 | Cha |
| 7,843,718 B2 | 11/2010 | Koh |
| 8,542,519 B2 | 9/2013 | Asao |
| 8,879,314 B2 | 11/2014 | Mani |

(Continued)

FOREIGN PATENT DOCUMENTS

| | | |
|---|---|---|
| CN | 1385905 A | 12/2002 |
| CN | 100407410 C | 7/2008 |

(Continued)

OTHER PUBLICATIONS

Supplementary Partial European Search Report in the European application No. 21772655.3, dated Jul. 14, 2022, 9 pgs.

(Continued)

*Primary Examiner* — Allison Bernstein
(74) *Attorney, Agent, or Firm* — Cooper Legal Group, LLC

(57) ABSTRACT

The present disclosure provides a semiconductor structure and a storage circuit that implements the storage structure of a magnetoresistive random access memory (MRAM) based on a dynamic random access memory (DRAM) fabrication platform.

18 Claims, 8 Drawing Sheets

(56) References Cited

U.S. PATENT DOCUMENTS

| | | |
|---|---|---|
| 9,570,138 B2* | 2/2017 | Toh ................. H10N 50/01 |
| 9,620,190 B2 | 4/2017 | Lee et al. |
| 10,008,537 B2 | 6/2018 | Li |
| 10,170,185 B2 | 1/2019 | Manipatruni et al. |
| 10,332,890 B2 | 6/2019 | Lee |
| 2002/0140016 A1 | 10/2002 | Cha |
| 2004/0061156 A1 | 4/2004 | Cha |
| 2007/0296007 A1 | 12/2007 | Park |
| 2008/0308887 A1 | 12/2008 | Asao |
| 2009/0027955 A1 | 1/2009 | Koh |
| 2011/0044093 A1 | 2/2011 | Koh |
| 2011/0215382 A1 | 9/2011 | Asao et al. |
| 2011/0254112 A1 | 10/2011 | Yamanaka |
| 2012/0099363 A1 | 4/2012 | Inaba |
| 2012/0286339 A1 | 11/2012 | Asao |
| 2014/0021520 A1 | 1/2014 | Asao |
| 2014/0063891 A1 | 3/2014 | Asao |
| 2014/0117477 A1 | 5/2014 | Park |
| 2014/0306277 A1 | 10/2014 | Asao |
| 2015/0035097 A1 | 2/2015 | Asao |
| 2015/0043272 A1 | 2/2015 | Zhou |
| 2015/0070982 A1 | 3/2015 | Miyakawa |
| 2015/0255506 A1 | 9/2015 | Asao |
| 2015/0294695 A1 | 10/2015 | Lee |
| 2016/0071906 A1 | 3/2016 | Asao |
| 2016/0225429 A1 | 8/2016 | Toh |
| 2016/0300612 A1 | 10/2016 | Manipatruni |
| 2018/0158871 A1 | 6/2018 | Lee |
| 2019/0305210 A1 | 10/2019 | Tahmasebi et al. |
| 2022/0190028 A1 | 6/2022 | Ping |
| 2022/0320422 A1* | 10/2022 | Ping .................. G11C 11/1675 |
| 2023/0026502 A1 | 1/2023 | Wang |

FOREIGN PATENT DOCUMENTS

| | | |
|---|---|---|
| CN | 103794716 A | 5/2014 |
| CN | 104733036 A | 6/2015 |
| CN | 104978991 A | 10/2015 |
| CN | 105321949 A | 2/2016 |
| CN | 108155147 A | 6/2018 |
| CN | 110323247 A | 10/2019 |
| CN | 111489777 A | 8/2020 |
| CN | 212136451 U | 12/2020 |
| JP | 5315940 B2 | 10/2013 |
| WO | 2019005129 A1 | 1/2019 |

OTHER PUBLICATIONS

International Search Report in the international application No. PCT/CN2021/095596, dated Jun. 17, 2021, 2 pgs.
International Search Report in the international application No. PCT/CN2021/095445, dated Jun. 22, 2021, 2 pgs.
Supplementary European Search Report in the European application No. 21843572.5, dated Dec. 9, 2022, 6 pgs.
Supplementary European Search Report in the European application No. 21772655.3, dated Oct. 18, 2022. 9 pages.
English translation of the Written Opinion of the International Search Authority in the international application No. PCT/CN2021/095596, dated Jun. 18, 2021. 4 pages.
English translation of the Written Opinion of the International Search Authority in the international application No. PCT/CN2020/128161, dated Mar. 30, 2021. 5 pages.
International Search Report in the international application No. PCT/CN2020/128161, dated Mar. 30, 2021. 2 pages.
Supplementary European Search Report in the European application No. 20925004.2, dated May 31, 2022. 6 pages.
Notice of Allowance of the U.S. Appl. No. 17/310,366, dated Jul. 3, 2023. 30 pages.

* cited by examiner

D5

D6

D1-D3

D1-D4

SEMICONDUCTOR STRUCTURE AND STORAGE CIRCUIT

CROSS-REFERENCE TO RELATED APPLICATIONS

This application is a continuation of International Application No. PCT/CN2021/095596, filed on May 24, 2021, which is based upon and claims priority to Chinese Patent Application No. 202011475739.X, filed on Dec. 15, 2020 in China Patent Office and entitled "Semiconductor Structure and Storage Circuit". The contents of International Application No. PCT/CN2021/095596 and Chinese Patent Application No. 202011475739.X are incorporated herein by reference in their entireties.

TECHNICAL FIELD

The present disclosure relates to the technical field of memories, in particular, to a semiconductor structure and a storage circuit.

BACKGROUND

A Magnetoresistive Random Access Memory (MRAM) is a non-volatile magnetic random access memory with characteristics of high read-write speed, high integration, and high number of repeated reads and writes, which has a wide application prospect.

However, the structure of the MRAM in the related art cannot be effectively combined with a Dynamic Random Access Memory (DRAM) fabrication platform.

SUMMARY

The present disclosure provides a semiconductor structure and a storage circuit that implements the storage structure of a MRAM based on a DRAM fabrication platform.

The present disclosure provides a semiconductor structure. The semiconductor structure includes: multiple first active regions that are separate from one another and located in a substrate; connection pads, each connection pad connects the ends of adjacent first active regions; and magnetic tunnel junctions, each magnetic tunnel junction is connected with a respective connection pad.

The present disclosure further provides a storage circuit. The storage circuit includes a bit line and a word line; a first transistor and a second transistor, the first transistor and the second transistor are connected with the word line respectively; a magnetic tunnel junction, one end of the magnetic tunnel junction is connected with the bit line, and another end of the magnetic tunnel junction is connected with one end of the first transistor and one end of the second transistor, respectively; and a first selection line and a second selection line, the first selection line and the second selection line are connected with another end of the first transistor and another end of the second transistor, respectively.

BRIEF DESCRIPTION OF THE DRAWINGS

To explain the embodiments of the present disclosure more clearly, references will now be made briefly to the accompanying drawings required for the embodiments. It will be apparent that the accompanying drawings in the following description are only some of the embodiments of the present disclosure, and other drawings may be obtained to those skilled in the art based on these accompanying drawings without involving any inventive efforts.

DETAILED DESCRIPTION

The technical solutions in the embodiments of the present disclosure will be described clearly and completely below with the reference of the accompanying drawings in the embodiments of the present disclosure. It will be apparent that the embodiments described herein are only a part of the embodiments of the present disclosure, rather than all the embodiments of the present disclosure. Based on the embodiments in present disclosure, all other embodiments obtained by those skilled in the art without involving inventive effort shall fall within the scope of the present disclosure.

The terms "first", "second", "third", and "fourth", etc. (if present) in the description and claims of the present disclosure and the above-mentioned accompanying drawings are used to distinguish similar objects, and are not necessarily used to describe a specific sequence or order. It should be understood that data used in this way may be interchangeable under appropriate cases so that the embodiments of the present disclosure described herein can be implemented, for example, in an order other than those illustrated or described herein. In addition, the terms "include" and "have" as well as any variations thereof are intended to cover non-exclusive inclusions. For example, processes, methods, systems, products, or devices that include a series of steps or units are not necessarily limited to those steps or units clearly listed, but may include other steps or units that are not clearly listed or are inherent to these processes, methods, products, or devices.

The present disclosure provides a semiconductor structure. The semiconductor structure includes multiple first active regions that are separate from one another and located in a substrate; connection pads, each connection pad connects ends of adjacent first active regions; and magnetic tunnel junctions, each magnetic tunnel junction is connected with a respective connection pad. The semiconductor structure provided by the present disclosure can be fabricated based on a DRAM fabrication platform, so that fabricating a DRAM and a MRAM on the same platform becomes more easily, and the production cost is reduced.

Figure 1:
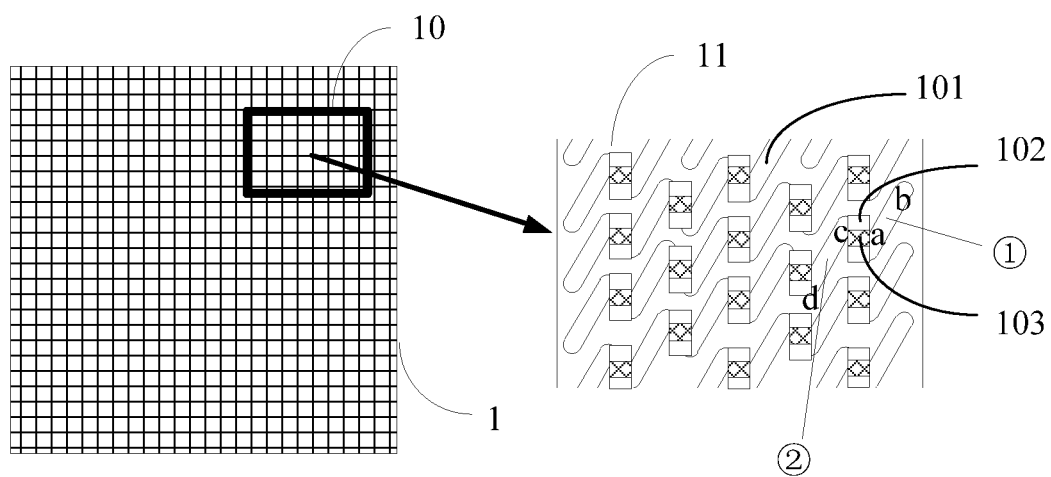
FIG. 1 is a structural schematic diagram of a semiconductor structure of an embodiment provided by the present disclosure.

FIG. 1 is a structural schematic diagram of a semiconductor structure of an embodiment provided by the present disclosure. The semiconductor structure 1 as illustrated in FIG. 1 includes an MRAM array, and the MRAM array includes multiple magnetic tunnel junctions (MTJ). The multiple MTJs may be distributed in rows and columns in an array form. Each MTJ may be used to perform read operation and write operation of the information.

In order to facilitate illustrating the structure of the semiconductor structure 1, any one rectangular region 10 in the semiconductor structure 1 is taken as an example in FIG. 1. As illustrated in FIG. 1, the semiconductor structure 1 provided by the present embodiment includes multiple first active regions 101 that are separate from one another and located in a substrate 11, multiple connection pads 102, and multiple MTJs 103. The substrate 11 includes a silicon substrate, a Silicon On Insulator (SOI) substrate, a gallium nitride substrate, a silicon carbide substrate, a gallium carbide substrate or other semiconductor substrates. Specifically, the first active regions 101 may be formed on the semiconductor substrate by a patterning fabrication process. A trench isolation structure (not illustrated in the figures) is formed between the first active regions 101.

Figure 2:
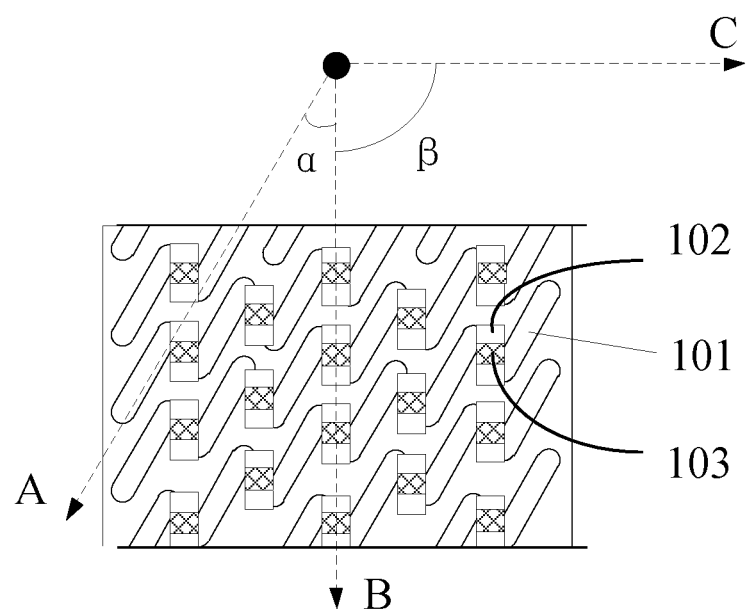
FIG. 2 is a schematic diagram of the extending directions of a semiconductor structure provided by the present disclosure.

Optionally, as illustrated in FIG. 2, multiple first active regions 101 in the substrate 11 are in an elongated shape, and the first active regions 101 extend in a first direction A. Specifically, the first active regions 101 have the same sizes and shapes, and are distributed in an array. Spacings between adjacent first active regions 101 in the first direction A are the same.

Optionally, the connection pads 102 are in an elongated shape, and each connection pad 102 connects ends of the adjacent first active regions 101 respectively. Specifically, each connection pad 102 may be connected with the ends of two adjacent active regions located in different columns. As illustrated in FIG. 1, for each connection pad 102, the first end of the connection pad 102 is connected with the end a of the first active region 101 labeled ①, and the second end of the connection pad 102 is connected with the end c of the first active region 101 labeled ②. Referring to FIG. 2, the connection pads 102 extend in a second direction B. There is a first included angle α between the first direction A and the second direction B, and the first included angle α may range from 15 degrees to 35 degrees.

Each MTJ 103 may be connected with the respective connection pad 102. For example, the MTJs 103 in the semiconductor structure 1 correspond to the connection pads 102 one by one. Each MTJ 103 is disposed on the corresponding connection pad 102. In FIG. 1, a rectangular region 10 that includes 7 rows and 5 columns with totally 18 connection pads 102 is taken as an example. The connection pads 102 in different rows are arranged in a staggered manner, and multiple MTJs 103 disposed on multiple connection pads 102 are also distributed in a staggered array. There are 18 MTJs 103 distributed in a staggered array with 7 rows and 5 columns in the rectangular region 10.

For the MTJs 103 in the semiconductor structure 1, each MTJ may be connected with the ends of two adjacent first active regions 101 to which a respective connection pad 102 is connected by this respective connection pad 102. The end of each first active region 101 may be the source or drain of a transistor (for example, the transistor may be an N-channel Metal Oxide Semiconductor (NMOS)). For example, the sources or drains of two adjacent first active regions 101 may be connected with one MTJ 103 by the respective connection pad 102 to implement that two transistors jointly drive one MTJ 103.

Optionally, the semiconductor structure 1 further includes first word lines, bit lines, selection lines, and other structures. The layered design structure of the semiconductor structure 1 provided by the embodiments of the present disclosure is described below in conjunction with FIG. 3 to FIG. 8. The rectangular region 10 of the semiconductor structure 1 in FIG. 1 can also be taken as an example in FIG. 3 to FIG. 8.

Figure 3:
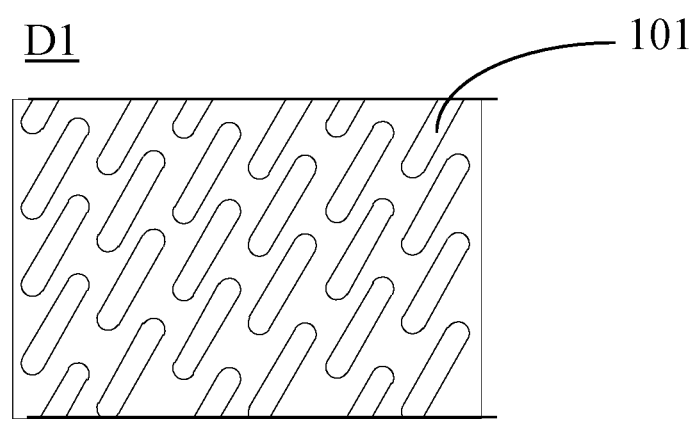
FIG. 3 is a structural schematic diagram of a layer D1 of a semiconductor provided by the present disclosure.

First layer (D1): FIG. 3 is a structural schematic diagram of a layer D1 of a semiconductor structure provided by the present disclosure. In the layer D1 illustrated in FIG. 3, the multiple first active regions 101 that are separate from one another and located in the substrate are arranged at intervals. Specifically, multiple first active regions 101 that are separate from one another may be formed in a silicon substrate by a patterning manner. The patterning manner includes, but is not limited to, Self-Aligned Double Patterning (SADP), Self-Aligned Quadruple Patterning (SAQP), and other semiconductor fabrication processes. A trench isolation structure (not shown in the figures) is formed between the first active regions 101.

Figure 4:
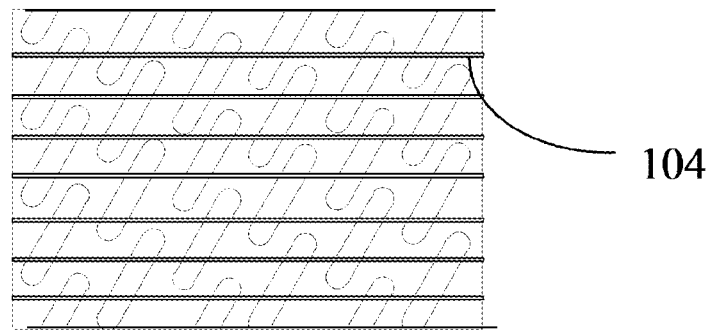
FIG. 4 is a structural schematic diagram of a layer D2 of a semiconductor provided by the present disclosure.

Second layer (D2): FIG. 4 is a structural schematic diagram of a layer D2 of a semiconductor structure provided by the present disclosure. Multiple first word lines 104 are arranged in parallel within the layer D2 illustrated in FIG. 4. The first word lines 104 may extend in a third direction C. In an example, as illustrated in FIG. 2, multiple MTJs 103 are distributed in an array in the second direction B and the third direction C. Furthermore, the spacings of adjacent MTJs 103 in each row in the third direction C are the same and the spacings of adjacent MTJs 103 in each column in the second direction B are the same. Optionally, an included angle β between the third direction C and the second direction B may be less than or equal to 90 degrees.

Optionally, the first word lines 104 are used to control the transistors connected with the respective MTJ 103. For example, the first word lines 104 of the layer D2 may be arranged above the layer D1. In another example, the first word lines 104 of the layer D2 may also be disposed in a manner of passing through the first active regions 101 of the layer D1. For each single first active region 101, it may be divided into two ends and one middle part by two adjacent first word lines 104. Specifically, each first active region 101 and the two first word lines 104 passing the first active region 101 form two transistors (MOS). The two transistors use the same source. The middle part of the first active region 101 is a common source of the two transistors, and the two ends of the first active region 101 are the drains of the two transistors respectively. Or, the two transistors use the same drain. The middle part of the first active region 101 is a common drain of the two transistors, and the two ends of the first active region 101 are the sources of the two transistors respectively. In an example, the first word lines 104 may be buried gate lines.

Figure 5:
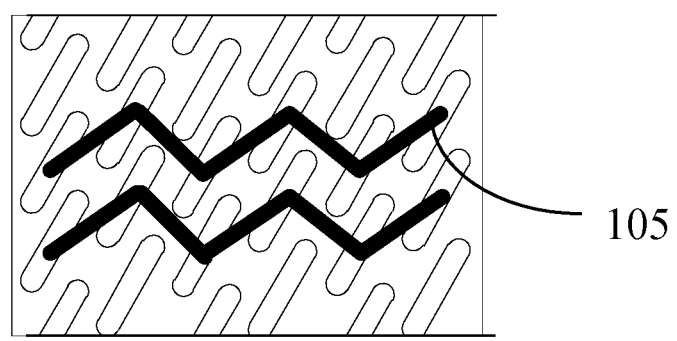
FIG. 5 is a structural schematic diagram of a layer D3 of a semiconductor provided by the present disclosure.
Figure 9:
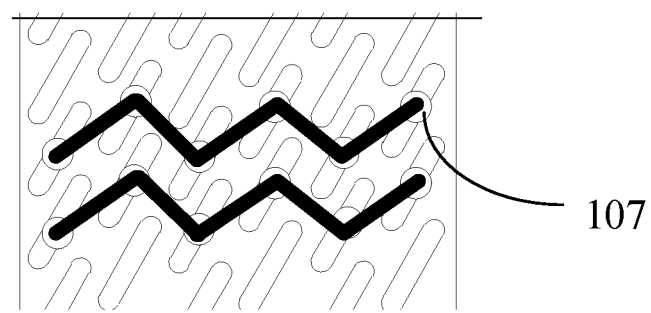
FIG. 9 is a structural schematic diagram of the first plugs of an embodiment provided by the present disclosure.

Third layer (D3): FIG. 5 is a structural schematic diagram of a layer D3 of a semiconductor structure provided by the present disclosure. Multiple selection lines 105 are arranged within the layer D3 illustrated in FIG. 5. The selection lines 105 may be polylines and may extend in a third direction C. The layer D3 may be arranged above the layer D1, and the selection lines 105 may be connected with the middle parts of the first active regions 101 by contact plugs. Specifically, the middle part of each first active region 101 is a common source or common drain of two transistors, and the respective selection line 105 may be connected with the common source or the common drain of the two transistors by the respective contact plugs. As illustrated in FIG. 9, the first plugs 107 may be located between the layer D1 and the layer D3, and the middle part of each first active region 101 may be connected with the respective selection line 105 by the first plug 107.

Figure 6:
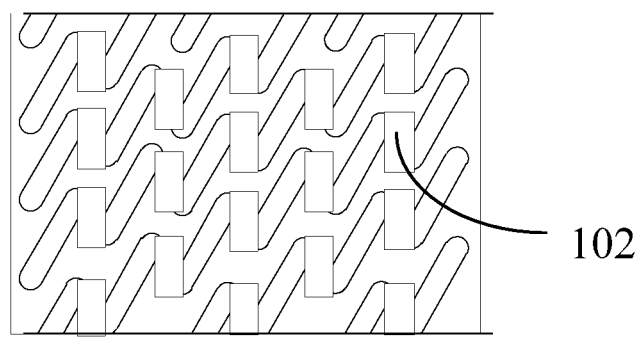
FIG. 6 is a structural schematic diagram of a layer D4 of a semiconductor provided by the present disclosure.

Fourth layer (D4): FIG. 6 is a structural schematic diagram of a layer D4 of a semiconductor structure provided by the present disclosure. Multiple connection pads 102 are arranged within the layer D4 as illustrated in FIG. 6. Descriptions for the connection pads 102 may refer to FIG. 1 and FIG. 2.

Figure 10:
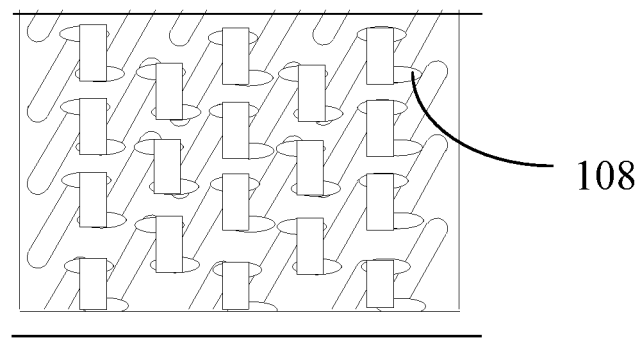
FIG. 10 is a structural schematic diagram of the second plugs of an embodiment provided by the present disclosure.

Optionally, each connection pad 102 is connected with the ends of adjacent first active regions 101. FIG. 10 is a structural schematic diagram of the second plugs of an embodiment provided by the present disclosure. As illustrated in FIG. 10, the second plugs 108 are located between the layer D1 and the layer D4. One end of each second plug 108 is connected with an end of the respective first active region 101, and another end of the second plug 108 is connected with one end of the respective connection pad 102. In combination with FIG. 9 and FIG. 10, the first plugs 107 may have a height less than that of the second plugs 108 to enable the selection lines 105 to be located below the connection pads 102, so as to ensure that the subsequent connection of the MTJs 103 will not be interfered. In another example, the first plugs 107 may have a height greater than that of the second plugs 108.

Figure 7:
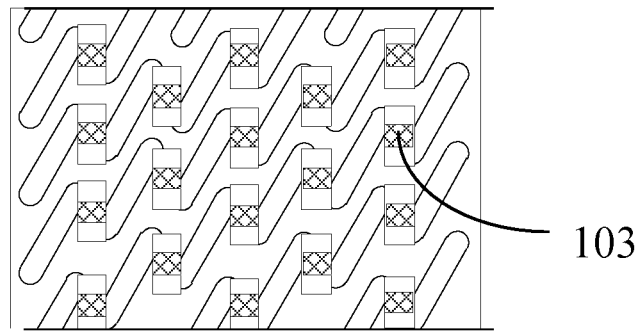
FIG. 7 is a structural schematic diagram of a layer D5 of a semiconductor provided by the present disclosure.

Fifth layer (D5): FIG. 7 is a structural schematic diagram of a layer D5 of a semiconductor structure provided by the present disclosure. Multiple MTJs 103 are arranged within the layer D5 as illustrated in FIG. 7. For example, the MTJs 103 are located above the connection pads 102 and are connected with the respective connection pads 102. Each MTJ 103 includes a free layer, a fixed layer, and a tunnel barrier layer, and stores information by using magnetic polarization directions of the free layer and the fixed layer. For example, when the magnetic polarization direction of the free layer and the fixed layer is parallel, the resistance is low, and the representing information is "1". When the magnetic polarization direction of the free layer and the fixed layer is anti-parallel, the resistance is high, and the representing information is "0".

Figure 8:
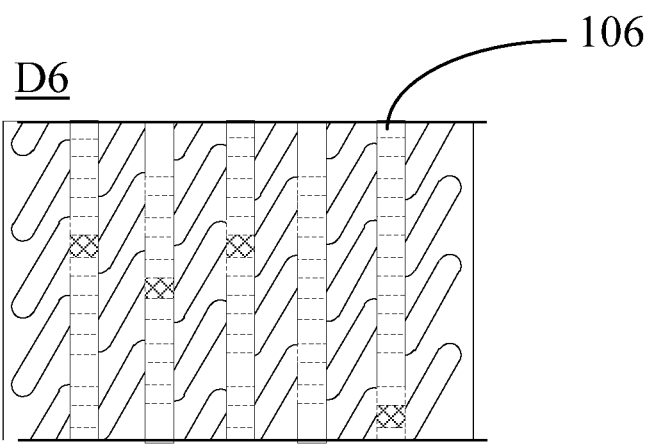
FIG. 8 is a structural schematic diagram of a layer D6 of a semiconductor provided by the present disclosure.

Sixth layer (D6): FIG. 8 is a structural schematic diagram of a layer D6 of a semiconductor structure provided by the present disclosure. Multiple bit lines 106 are arranged within the layer D6 as illustrated in FIG. 8. The bit lines 106 extend in a direction (which is the second direction B in the present embodiment) perpendicular to the third direction C. Furthermore, each bit line 106 is used to connect the upper ends of one column of MTJs 103 in the second direction B in FIG. 1 and FIG. 2.

Figure 12:
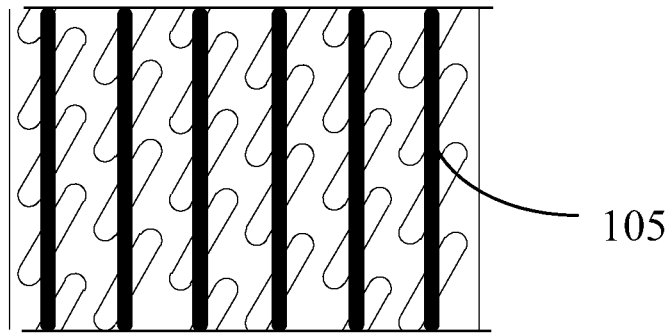
FIG. 12 is a structural schematic diagram of a layer D3 of a semiconductor of another embodiment provided by the present disclosure.

Optionally, FIG. 12 is a structural schematic diagram of layer D3 of a semiconductor of another embodiment provided by the present disclosure. As illustrated in FIG. 12, multiple selection lines 105 are arranged within the layer D3. The selection lines 105 may be straight lines. An extending direction of the selection lines 105 may be perpendicular to the third direction C. Specifically, the multiple selection lines 105 are arranged at equal intervals in the same direction. The extending direction of the selection lines 105 may be the same as the second direction B, or the extending direction of the selection lines 105 may be the same as the extending direction of the bit lines 106. Each selection line 105 may be connected with the middle parts of the respective first active regions 101 in the same column. The structures of a layer D1, a layer D2, a layer D4, a layer D5, and a layer D6 are the same as those in the previous embodiments, and will not be elaborated herein.

Figure 13:
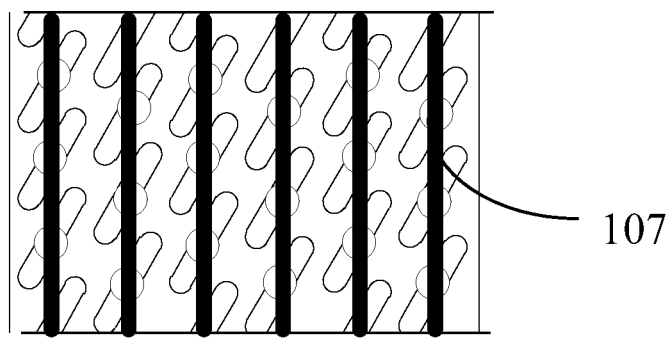
FIG. 13 is a structural schematic diagram of the first plugs of another embodiment provided by the present disclosure.
Figure 14:
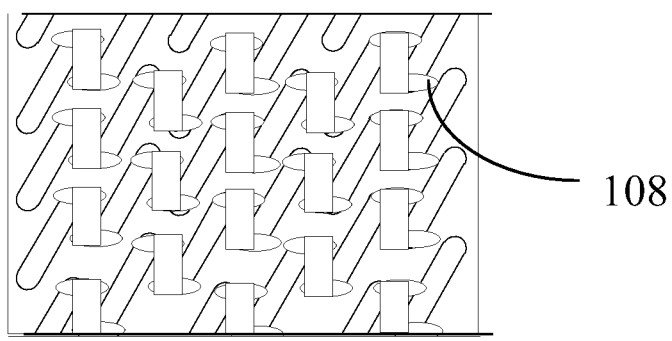
FIG. 14 is a structural schematic diagram of the second plugs of another embodiment provided by the present disclosure.

Optionally, each selection line 105 may be connected with the respective first active regions 101 by the respective first plugs. FIG. 13 is a structural schematic diagram of the first plugs of another embodiment provided by the present disclosure. As illustrated in FIG. 13, each first plug 107 is located between the layer D1 and the layer D3, and the middle part of each first active region 101 may be connected with the respective selection line 105 by a first plug 107. Specifically, the middle parts of the first active regions 101 in the same column may be connected to the same selection line 105. Two end of each connection pad 102 may be connected with the ends of adjacent first active regions 101 by the respective second plugs. FIG. 14 is a structural schematic diagram of the second plugs of another embodiment provided by the present disclosure. As illustrated in FIG. 14, the second plugs 108 are located between the layer D1 and the layer D4. One end of each second plug 108 is connected with the end of the respective first active region 101, and another end of the second plug 108 is connected with one end of the respective connection pad 102.

Optionally, in combination with FIG. 12 and FIG. 13, the first plugs 107 may have a height equal to that of the second plugs 108. At this case, the layer D3 and the layer D4 may be located on the same layer. The selection lines 105 and the connection pads 102 are arranged at intervals. Specifically, the first plugs 107 and the second plugs 108 may be formed in the same process step. For example, conductive materials may be simultaneously formed in a first through hole for fabricating the first plugs and a second through hole for fabricating the second plugs to form the first plugs and the second plugs. The conductive material may be at least one of Titanium Nitride (TiN), Wolfram (W), Tantalum Nitride (TaN), Cobalt (Co), Aluminum (AL), Wolfram Nitride (WN), polycrystalline silicon, or silicon germanide.

Figure 16:
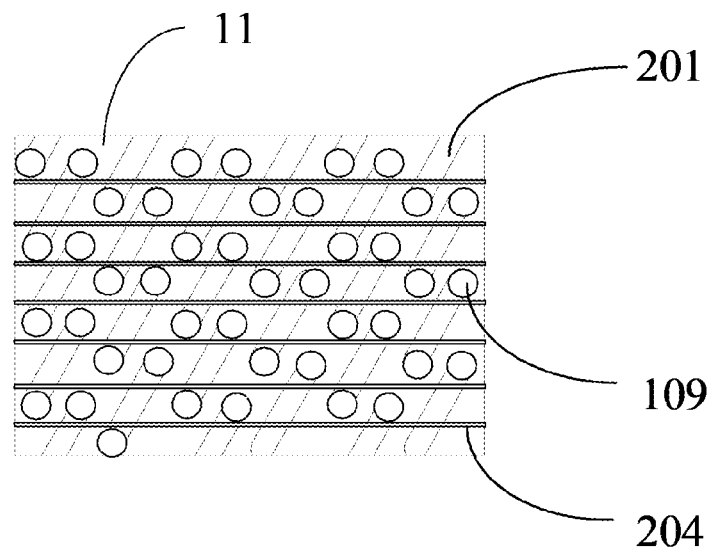
FIG. 16 is a schematic diagram of a capacitor storage structure provided by the present disclosure.

Optionally, each first active region 101 connected with the respective connection pad 102 is located in a first region of a substrate 11. The semiconductor structure of another embodiment provided by the present disclosure further includes the second active regions 201 located in a second region of the substrate 11; and the capacitor storage structures 109, each capacitor storage structure 109 may be connected with an end of a respective second active region 201 by a capacitor contact plug. Specifically, as illustrated in FIG. 16, the second region of the substrate 11 is a capacitor storage region. The specific relative position relationship between the first region and the second region is not limited. The first region and the second region may be proximate regions on the substrate 11, or may be two regions separated by other device structures, such as a DRAM storage region and an MRAM storage region which are separated by a peripheral control device.

Optionally, the first active regions 101 have same size, the shape, and the arrangement pattern as that of the second active regions 201. Specifically, the first active regions 101 and the second active regions 201 are both in an elongated shape. The lengths and the widths of the first active regions 101 and the second active regions 201 are the same. The extending directions of the first active regions 101 and the second active regions 201 are the same. The spacings of the first active regions 101 and the spacings of the second active regions 201 are the same. The first active regions 101 and the second active regions 201 are arranged in arrays.

Optionally, the first active regions 101 and the second active regions 201 are formed in the same process step. Specifically, the first active regions 101 and the second active regions 201 may be formed within the substrate 11 by the same photoetching and etching steps under the same photoetching conditions and etching conditions. For example, the photoetching process is performed with the same light mask plate, and the etching is performed with the same etching material.

Optionally, the semiconductor structure further includes the second word lines 204. Each second active region 201 is passed by two second word lines 204. For each second active region 201, it may be divided into two ends and one middle part by two adjacent second word lines 204. Specifically, each second active region 201 and the two respective first word lines 204 passing this second active region 201 form two transistors (MOS). The two transistors use the same source, the middle part of the second active region 201 is a common source of the two transistors, and the two ends of the second active region 201 are the drains of the two transistors respectively. Or, the two transistors use the same drain, the middle part of the second active region 201 is a common drain of the two transistors, and the two ends of the second active region 201 are the sources of the two transistors respectively. In an example, the second word line 204 may be a buried gate line. In other examples, the second word lines 204 may be located above the second active regions 201.

Optionally, the first word lines 104 and the second word lines 204 are formed in the same process step. Specifically, the first word lines 104 and the second word lines 204 have the same size, the shape, and the arrangement pattern. For example, the widths of the first word lines 104 and the widths of the second word lines 204 are the same. The spacings of the first word lines 104 and the spacings of the second word lines 204 are the same. The first word lines 104 and the second word lines 204 have the same extending direction, and extend in the third direction C. As such, the first word lines 104 and the second word lines 204 may be formed in the same process step. Specifically, the first word lines 104 and the second word lines 204 may be formed by using the same photoetching process and the same etching process.

Optionally, the first word lines 104 pass through the first active regions 101 and the second active regions 201. Specifically, the ends of first active regions 101 are connected with the respective MTJs, and the ends of second active regions 201 are connected with the respective capacitor storage structures. Each first active region 101 and second active region 201 are passed by the respective first word line 104 so that each MTJ and the respective capacitor storage structure can be simultaneously controlled by the same word line to improve the control capability for the information storage.

Figure 17:
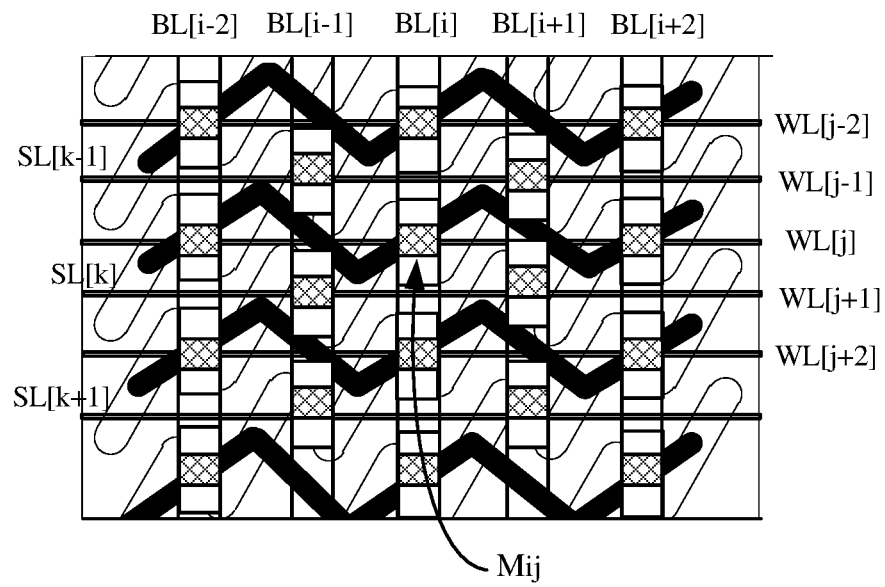
FIG. 17 is a schematic diagram of the structure of a semiconductor provided by the present disclosure.

FIG. 17 is a structural schematic diagram of a semiconductor structure provided by an embodiment of the present disclosure. FIG. 17 illustrates the structure obtained by combining the layer D1 in FIG. 3 to the layer D6 in FIG. 8. The specific structures of each layer are based on FIG. 3 to FIG. 8. For the MTJ Mij in the ith row and jth column in FIG. 17, the present disclosure further provides a control method for a first word line, a bit line and a selection line which are connected with the MTJ Mij to implement the control for the MTJ Mij.

Figure 18:
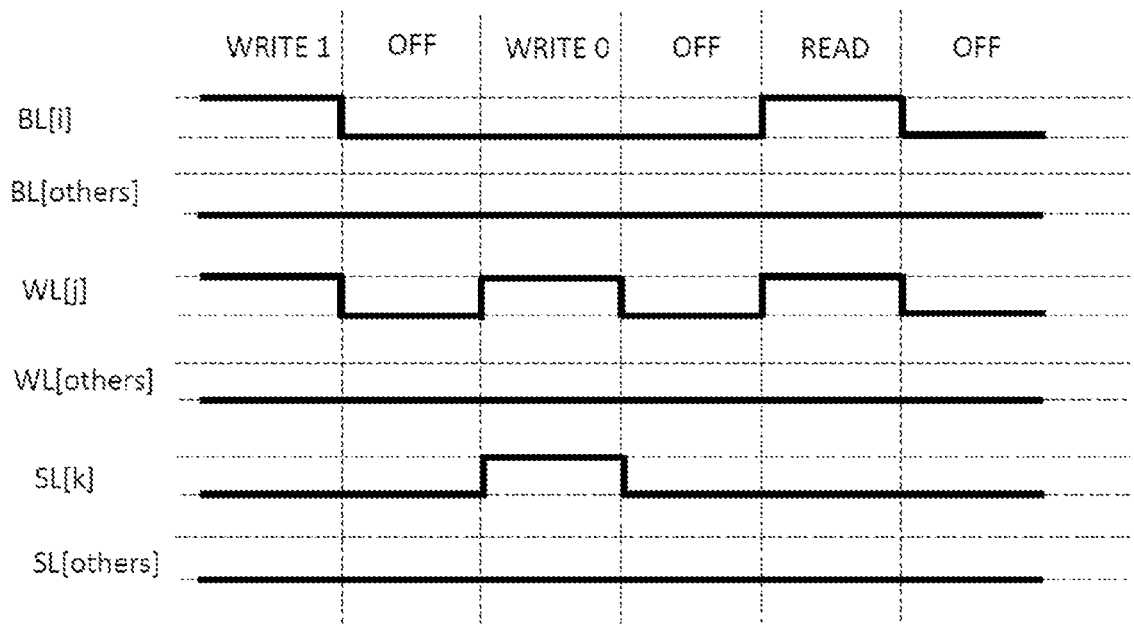
FIG. 18 is a schematic diagram of a control level of a magnetic tunnel junction provided by the present disclosure.

Specifically, FIG. 18 is a schematic diagram of a control level of the MTJs provided by the present disclosure. Herein, when the bit line BL[i] connected with the MTJ Mij is a high level and other bit lines BL[others] not connected with the MTJ Mij are a low level, the first word line WL[j] controlling the MTJ Mij is a high level, other first word lines WL[others] not connected with the MTJ Mij are a low level, the selection line SL[k] connected with the MTJ Mij is a low level, and other selection lines SL[others] not connected with the MTJ Mij are a low level, the MTJ Mij performs the operation of witting information "1" (WRITE1). When the bit line BL[i] connected with the MTJ Mij is a low level and other bit lines BL[others] not connected with the MTJ Mij are a low level, the first word line WL[j] controlling the MTJ Mij is a high level and other first word lines WL[others] not connected with the MTJ Mij are a low level, and the selection line SL[k] connected with the MTJ Mij is a high level and other selection lines SL[others] not connected with the MTJ Mij are a low level, the MTJ Mij performs the operation of witting information "0" (WRITE0). When the bit line BL[i] connected with the MTJ Mij is a high level, other bit lines BL[others] not connected with the MTJ Mij are a low level, the first word line WL[j] controlling the MTJ Mij is a high level, other first word lines WL[others] not connected with the MTJ Mij are a low level, the selection line SL[k] connected with the MTJ Mij is a low level, and other selection lines SL[others] not connected with the MTJ Mij are a low level, the MTJ Mij performs the operation of reading information (READ). When the bit line BL[i] connected with the MJT Mij is a low level, the first word line WL[i] connected with the MJT Mij is a low level, and the selection line SL[k] connected with the MJT Mij is a low level, the MJT Mij is in an OFF state and does not perform read operation or write operation.

Figure 11:
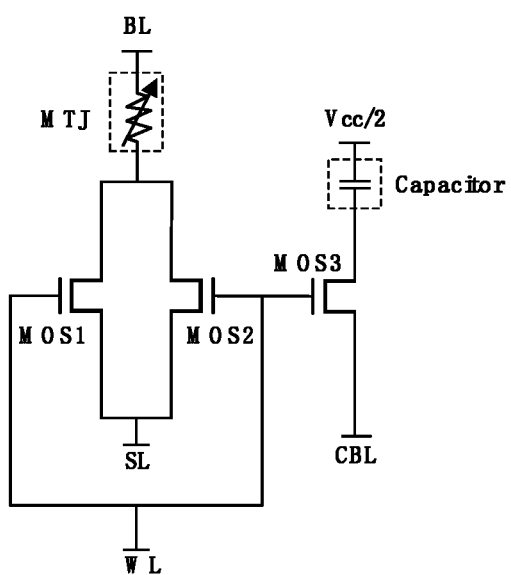
FIG. 11 is a schematic diagram of a storage circuit of an embodiment provided by the present disclosure.

Another embodiment of the present disclosure provides a storage circuit. As illustrated in FIG. 11, FIG. 11 illustrates a storage circuit of a single MTJ storage unit. One end of an MTJ is connected with a bit line BL, and another end of the MTJ is connected with the source (or drain) of a first transistor (MOS1) and a second transistor (MOS2). The drains (or sources) of the first transistor (MOS1) and the second transistor (MOS2) are connected to the same selection line (SL). The gates of the first transistor (MOS1) and the second transistor (MOS2) are connected to the same word line (WL). The current provided by the MOS1 and the MOS2 drive the connected MTJ together, so that the current for driving the MTJ is increased, and the accuracy of reading or writing information for the MTJ is improved. Meanwhile, the gates of the MOS1 and the MOS2 are connected to the same word line and the drains (or sources) of the MOS1 and the MOS2 are connected to the same selection line, thereby simplifying the circuit design and reducing the fabricating cost.

Optionally, the storage circuit further includes a third transistor (MOS3). One end of the third transistor (MOS3) is connected with a capacitor storage structure (Capacitor), and another end of the third transistor (MOS3) is connected with a capacitor storage bit line (CBL). The CBL is used to read data from or write data to the Capacitor. The third transistor (MOS3) is further connected with the word line (WL), and the WL is used to control the first transistor (MOS1), the second transistor (MOS2) and the third transistor (MOS3).

Figure 15:
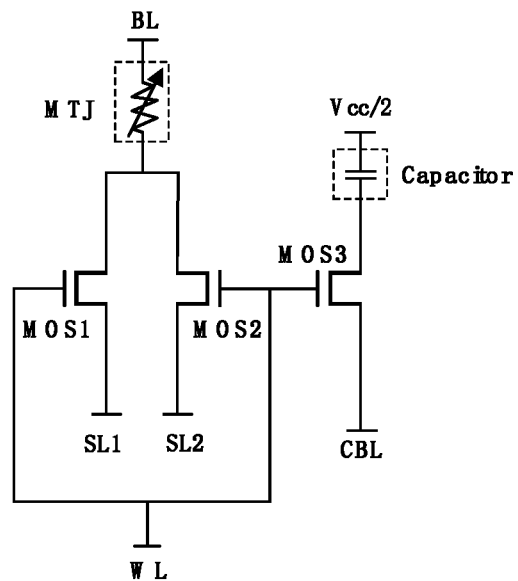
FIG. 15 is a schematic diagram of a storage circuit of another embodiment provided by the present disclosure.

Another embodiment of the present disclosure further provides a storage circuit. As illustrated in FIG. 15, FIG. 15 illustrates a storage circuit of a single MTJ storage unit. Herein one end of the MTJ is connected with a bit line (BL), and another end of the MTJ is connected with the sources (or drains) of a first transistor (MOS1) and a second transistor (MOS2); the drains (or sources) of the first transistor (MOS1) and the second transistor (MOS2) are connected to a first selection line (SL1) and a second selection line (SL2); and the gates of the first transistor (MOS1) and the second transistor (MOS2) are connected to the same word line (WL). The current provided by the MOS1 and the MOS2 drive the connected MTJ together, so that the current for driving the MTJ is increased, and the accuracy of reading or writing information for the MTJ is improved. Meanwhile, the gates of the (MOS1) and the (MOS2) are connected to the same word line, thereby simplifying the circuit design and reducing the fabricating cost. The MTJ is driven by the first selection line (SL1) and the second selection line (SL2), thus improving the adjustability of control.

Optionally, as illustrated in FIG. 15, the storage circuit further includes a third transistor (MOS3). One end of the third transistor (MOS3) is connected with a capacitor storage structure (Capacitor), and another end of the third transistor (MOS3) is connected with a capacitor storage bit line (CBL). The capacitor storage bit line (CBL) is used to read data from or write data to the capacitor storage structure (Capacitor). The third transistor (MOS3) is further connected with the word line (WL), and the word line (WL) is used to control the first transistor (MOS1), the second transistor (MOS2) and the third transistor (MOS3).

The above various embodiments are only used to describe the technical solutions of the present disclosure, and not intended to limit the present disclosure. Although the present disclosure has been described in detail with reference to the foregoing embodiments, those ordinarily skilled in the art should understand that they can still modify the technical solutions described in all the foregoing embodiments, or equivalently replace some or all of the technical features, and these modifications or replacements do not depart the essences of the corresponding technical solutions from the spirit and scope of the technical solutions of all the embodiments of the present disclosure.

The invention claimed is:

1. A semiconductor structure, comprising:
multiple first active regions that are separate from one another and located in a substrate;
connection pads, each of the connection pads connecting ends of adjacent first active regions of the multiple first active regions; and
magnetic tunnel junctions, each of the magnetic tunnel junctions being connected with a respective one of the connection pads;
wherein each of the multiple first active regions connected with a respective one of the connection pads is located in a first region of the substrate, and
the semiconductor structure further comprises;
second active regions located in a second region of the substrate; and
capacitor storage structures, each of the capacitor storage structures being connected with an end of a respective one of the second active regions by a capacitor contact plug.

2. The semiconductor structure of claim 1, wherein
the multiple first active regions are in an elongated shape and extend in a first direction; and
the connection pads are in an elongated shape and extend in a second direction, wherein there is a first included angle between the first direction and the second direction.

3. The semiconductor structure of claim 2, wherein the first included angle ranges from 15 degrees to 35 degrees.

4. The semiconductor structure of claim 2, further comprising:
first word lines, passing through the multiple first active regions and extending in a third direction.

5. The semiconductor structure of claim 3, wherein
the magnetic tunnel junctions are distributed in a staggered array; and
spacings of the magnetic tunnel junctions in a third direction are the same and spacings of the magnetic tunnel junctions in the second direction are the same.

6. The semiconductor structure of claim 4, wherein
each of the multiple first active regions is divided into two ends and a middle part by two of the first word lines.

7. The semiconductor structure of claim 4, further comprising:
bit lines, each of the bit lines being connected with a respective one of the magnetic tunnel junctions, and extending in a direction perpendicular to the third direction.

8. The semiconductor structure of claim 6, further comprising:
selection lines, each of the selection lines being connected with the middle parts of a respective one of the multiple first active regions.

9. The semiconductor structure of claim 8, wherein
the selection lines extend in the third direction, and the selection lines are polylines.

10. The semiconductor structure of claim 8, further comprising:
first plugs, each of the first plugs connecting the middle part of a respective one of the multiple first active region with a respective one of the selection lines; and
second plugs, each of the second plugs connecting an end of a respective one of the multiple first active regions with a respective one of the connection pads, wherein the first plugs have a height less than that of the second plugs.

11. The semiconductor structure of claim 8, wherein
the selection lines extend in a direction perpendicular to the third direction, and the selection lines are straight lines; and
the semiconductor structure further comprises:
first plugs, each of the first plugs connecting the middle part of a respective one of the multiple first active regions with a respective one of the selection lines; and
second plugs, each of the second plugs connecting an end of a respective one of the multiple first active regions with a respective one of the connection pads.

12. The semiconductor structure of claim 11, wherein
the first plugs have a same height as that of the second plugs; and the first plugs and the second plugs are formed in a same process step.

13. The semiconductor structure of claim 8, wherein
two transistors control a same one of the magnetic tunnel junctions, the two transistors use a same one of the first word lines; and
the two transistors use a same one of the selection lines.

14. The semiconductor structure of claim 1, wherein
the first active regions have same size, shape, and arrangement pattern as that of the second active regions; or
the first active regions and the second active regions are formed in a same process step.

15. The semiconductor structure of claim 1, further comprising:
first word lines, passing through the multiple first active regions and extending in a third direction; and
second word lines, wherein each of the second active regions is passed by two of the second word lines; wherein the first word lines and the second word lines are formed in a same process step.

16. The semiconductor structure of claim 1, further comprising:
first word lines, passing through the multiple first active regions and extending in a third direction; wherein the first word lines pass through the multiple first active regions and the second active regions.

17. A storage circuit, comprising:
a bit line and a word line;
a first transistor and a second transistor, the first transistor and the second transistor being connected with the word line respectively;
a magnetic tunnel junction, one end of the magnetic tunnel junction being connected with the bit line, and another end of the magnetic tunnel junction being connected with one end of the first transistor and one end of the second transistor, respectively;
a first selection line and a second selection line, the first selection line and the second selection line being connected with another end of the first transistor and another end of the second transistor, respectively;
a third transistor connected with the word line; and
a capacitor storage bit line connected with one end of the third transistor, and a capacitor storage structure connected with another end of the third transistor.

18. The storage circuit of claim 17, wherein
the first selection line and the second selection line are connected to each other.

* * * * *